(12) United States Patent
Ai et al.

(10) Patent No.: US 10,600,989 B1
(45) Date of Patent: *Mar. 24, 2020

(54) ELECTRONIC DEVICES WITH FLEXIBLE DISPLAYS

(71) Applicant: Apple Inc., Cupertino, CA (US)

(72) Inventors: Jiang Ai, Cupertino, CA (US); Erik A. Uttermann, San Francisco, CA (US); Soyoung Kim, San Jose, CA (US)

(73) Assignee: Apple Inc., Cupertino ( * ) Notice: Subject to any disclaimer, the term of this patent is extended or adjusted under 35 U.S.C. 154(b) by 0 days.

This patent is subject to a terminal disclaimer.

(21) Appl. No.: 16/019,431

(22) Filed: Jun. 26, 2018

Related U.S. Application Data

(63) Continuation of application No. 15/177,025, filed on Jun. 8, 2016, now Pat. No. 10,020,462.

(60) Provisional application No. 62/199,187, filed on Jul. 30, 2015.

(51) Int. Cl.
*H01L 51/52* (2006.01)

(52) U.S. Cl.
CPC .... *H01L 51/524* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 7,034,915 B2 | 4/2006 | Nishiki | |
| 7,180,665 B2 | 2/2007 | Daniel et al. | |
| 8,358,395 B1 | 1/2013 | Szeremeta | |
| 9,098,242 B2 | 8/2015 | Rappoport | |
| 9,203,050 B2 | 12/2015 | Jeong et al. | |
| 9,295,168 B2 | 3/2016 | Baek | |
| 9,627,637 B2 | 4/2017 | Kwon | |
| 10,020,462 B1* | 7/2018 | Ai | H01L 51/524 |
| 2011/0050657 A1* | 3/2011 | Yamada | H01L 27/3293 345/204 |
| 2011/0148797 A1 | 6/2011 | Huitema et al. | |
| 2012/0307423 A1 | 12/2012 | Bohn et al. | |
| 2012/0314399 A1 | 12/2012 | Bohn et al. | |
| 2013/0083496 A1 | 4/2013 | Franklin et al. | |
| 2013/0169515 A1* | 7/2013 | Prushinskiy | G06F 1/1652 345/55 |
| 2014/0042406 A1 | 2/2014 | Degner et al. | |
| 2014/0240985 A1 | 8/2014 | Kim et al. | |
| 2014/0346474 A1 | 11/2014 | Jeong et al. | |

(Continued)

*Primary Examiner* — Lex H Malsawma

(74) *Attorney, Agent, or Firm* — Treyz Law Group, P.C.; G. Victor Treyz; Kendall W. Abbasi

(57) ABSTRACT

An electronic device may have a hinge that allows the device to be flexed about a bend axis. A display may span the bend axis. To facilitate bending about the bend axis, the display may have layers such as a display cover layer with grooves or other recesses. The recesses form a flexible portion in the display layer. The display layer may be formed from glass or other materials that are transparent. Elastomeric material, fluids, and other materials may be placed in the recesses in the display layer. The material in the display layer may have an index of refraction that is matched to the index of refraction of the display layer. A hinge may be formed between rigid planar layers that are separated by a gap. Flexible layers that lie flush with opposing surfaces of the rigid planar layers may be used to span the gap.

20 Claims, 19 Drawing Sheets

(56) References Cited

U.S. PATENT DOCUMENTS

| | | | |
|---|---|---|---|
| 2015/0146386 A1* | 5/2015 | Namkung | H05K 1/028 361/749 |
| 2015/0227172 A1* | 8/2015 | Namkung | G06F 1/1652 345/173 |
| 2016/0181345 A1* | 6/2016 | Lee | H01L 27/3276 257/40 |
| 2016/0224066 A1* | 8/2016 | Hussa | G06F 1/1652 |

* cited by examiner

ELECTRONIC DEVICES WITH FLEXIBLE DISPLAYS

This application is a continuation of patent application Ser. No. 15/177,025, filed Jun. 8, 2016, which claims the benefit of provisional patent application No. 62/199,187, filed Jul. 30, 2015, both of which are hereby incorporated by reference herein in their entireties.

BACKGROUND

This relates generally to electronic devices, and, more particularly, to electronic devices with displays.

Electronic devices often include displays for presenting image to a user. Displays are typically formed from rigid planar substrates. Although satisfactory in many situations, rigid displays such as these may be difficult to integrated into certain devices, such as devices with bendable housings.

It would therefore be desirable to be able to provide improved displays for electronic devices.

SUMMARY

An electronic device may have a display. The electronic device may have a hinge that allows the device to be flexed about a bend axis. The display may overlap the bend axis.

To facilitate bending of the display about the bend axis, the display may have one or more layers such as an outer display cover layer with grooves or other recesses. The display cover layer may be formed from glass or other transparent materials. The recesses may form a flexible portion in a display layer that allows glass or other transparent materials of the display layer to bend about the bend axis.

The grooves or other recesses may be filled with polymer or other materials. In some configurations, a display layer may have openings that are filled with liquids. In display layer arrangements with flexible glass or polymer structures, the material that fills the grooves or other openings in the display layer may have an index of refraction value that matches the index of refraction of the glass or polymer structures.

A hinge may be formed between rigid planar layers that are separated by a gap. The rigid planar layers may be glass layers or other transparent layers in a display or may be housing walls or other structural portions of an electronic device. Flexible layers that lie flush with opposing surfaces of the rigid planar layers may be used to span the gap and form the hinge.

DETAILED DESCRIPTION

Figure 1:
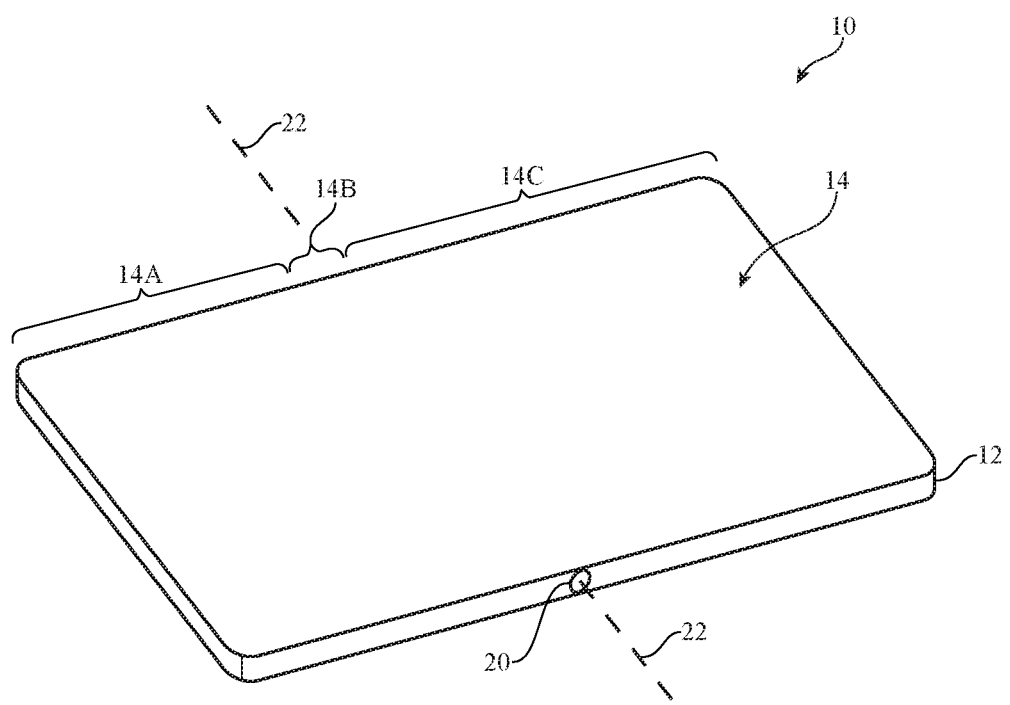
FIG. 1 is a perspective view of an illustrative electronic device having a display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a wearable or miniature device of other types, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have hinge structures such as hinge 20 to allow device 10 to bend about bend axis 22.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, microelectromechanical (MEMS) shutter pixels, electrowetting pixels, micro-light-emitting diodes (small crystalline semiconductor die), organic light-emitting diodes (e.g., a thin-film organic light-emitting diode display), or pixels based on other display technologies. Display 14 may be formed from a single display panel (e.g., a single organic light-emitting diode layer) or may be formed form two panels (e.g., two organic light-emitting diode layers, two liquid crystal display modules, etc.).

In a configuration with a single display panel, the center of the display panel may be formed using flexible structures. A display cover layer or other layer may form the outermost surface of the display. Display layers such these (e.g., display cover layers) may be formed from glass, plastic, and/or other transparent display cover layer structures and may have a flexible center portion aligned with the bend axis of device 10. As shown in FIG. 1, for example, display 14 may have three areas such as areas 14A, 14B, and 14C. In areas 14A and 14C, display 14 may be flexible or may be rigid (e.g., the display panel structures in these areas may be rigid and/or the display cover layer structures in these areas may be rigid). Flexible area 14B forms a strip that lies between areas 14A and 14C. To ensure that flexible area 14B is sufficiently flexible to allow device 10 to bend about axis 22, display layers such as a display cover layer for display 14 may be provided with flexible structures in area 14B. Underlying display layers in a display panel (e.g., a polymer substrate, metal traces, and other conducting and dielectric layers in an organic light-emitting diode panel) may also be provided with structures that are flexible and can be bent without damage.

In a configuration with two display panels, a first of the two panels may form a rigid display in area 14A and a second of the two display panels may form a rigid display in area 14C. In flexible area 14B, the display structures that form the two display panels may be omitted and the overlapping display cover layer for display 14 may be provided with grooves or other structures to facilitate bending.

Figure 2:
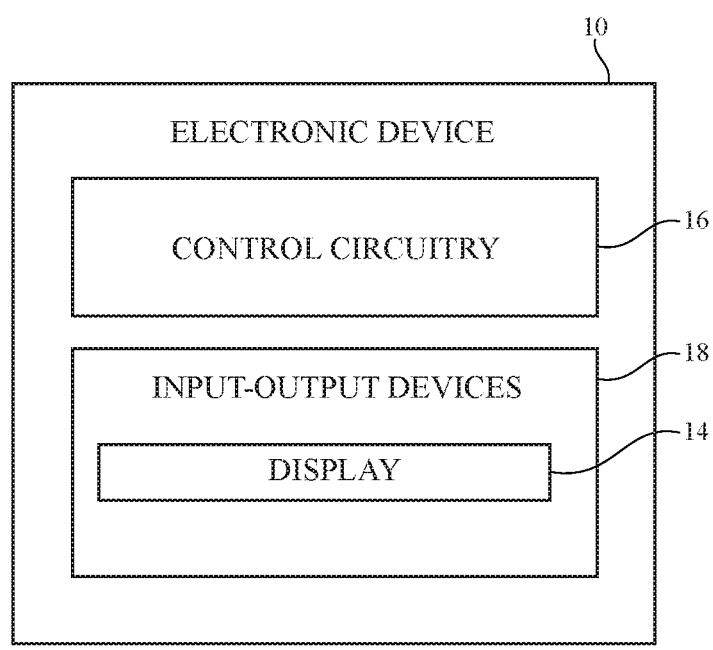
FIG. 2 is a schematic diagram of an illustrative electronic device having a display in accordance with an embodiment.

A schematic diagram of an illustrative electronic device such as device 10 of FIG. 1 is shown in FIG. 2. As shown in FIG. 2, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18. Input-output devices 18 may include a display such as display 14 of FIG. 1.

Control circuitry 16 may be used to run software on device 10 such as operating system code and applications. During operation of device 10, the software running on control circuitry 16 may display images on display 14 (e.g., video, still images such as text, alphanumeric labels, photographs, icons, other graphics, etc.) using an array of pixels in display 14.

Figure 3:
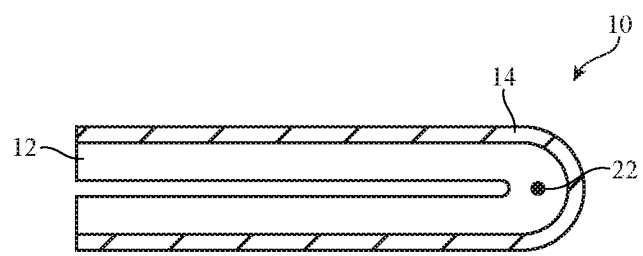
FIGS. 3 and 4 are cross-sectional side views of electronic devices with flexible displays in accordance with an embodiment.
Figure 4:
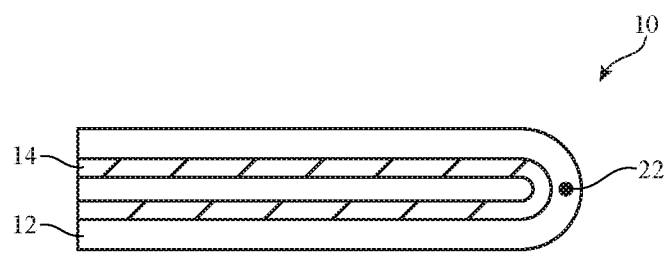

As shown in FIG. 3, device 10 may be folded (bent by 180° or other suitable amount) about bend axis 22 so that display 14 is visible from the outside of device 10 in its folded state. FIG. 4 shows how device 10 may be folded about bend axis 22 so that display 14 is protected within the interior of device 10. Device 10 may have hinges that allow outward bending of the type shown in FIG. 3, that allow inward bending of the type shown in FIG. 4, or that allow bending of both the type shown in FIG. 3 and the type shown in FIG. 4. Configurations in which device 10 is flexed by different amounts (e.g., more than 180° or less than 180°) may also be used.

Display 14 may have an outermost layer formed from clear glass, transparent plastic, sapphire, or other transparent materials that serve as a protective layer for thin-film transistor circuitry and other display structures. The outer display layer may sometimes be referred to as a display cover layer. In some configurations for display 14, the outermost layer of the display may serve both as a protective layer (display cover layer) and as a substrate for display structures (touch sensors electrodes, color filter elements, thin-film transistors, etc.). In other configurations, the display cover layer is free of circuitry and serves solely as a protective layer for underlying display structures (e.g., one or more underlying display panels).

Figure 5:
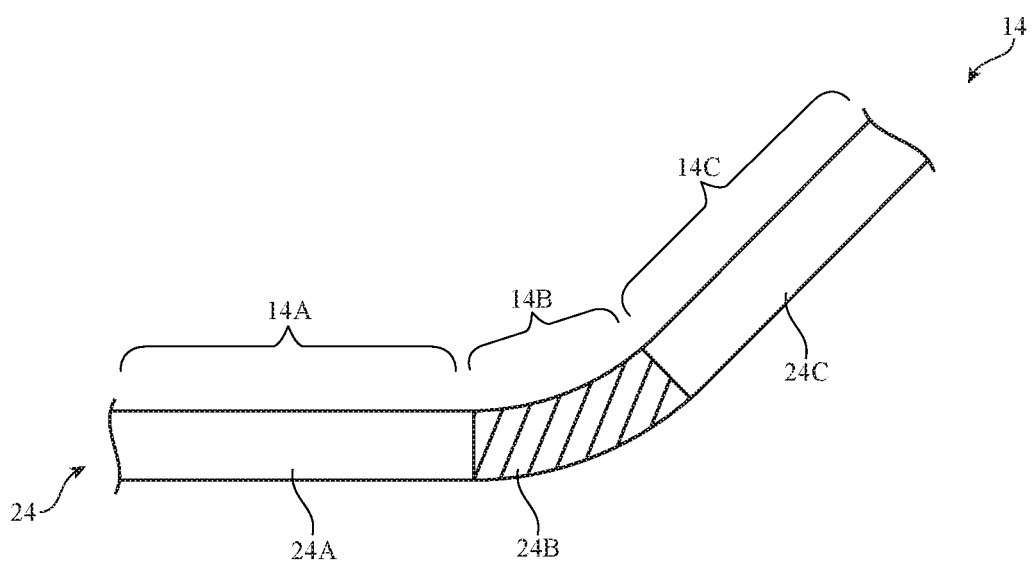
FIG. 5 is a cross-sectional side view of an illustrative display cover layer with a flexible portion in accordance with an embodiment.

As shown in FIG. 5, the display cover layer for display 14 (i.e., display cover layer 24) may have outer portions 24A and 24C that are formed on opposing sides of center portion 24B. Outer portions 24A and 24C may, for example, be rigid planar layers. Configurations in which portions 24A and 24C have non-planar shapes and/or are formed from flexible structures may also be used. Between rigid planar portions 24A and 24C of display cover layer 24, display cover layer 24 may have a flexible portion such as portion 24B. Portion 24B may bend about bend axis 22 to allow display 14 to bend as housing 12 is bent about hinge 20.

Figure 6:
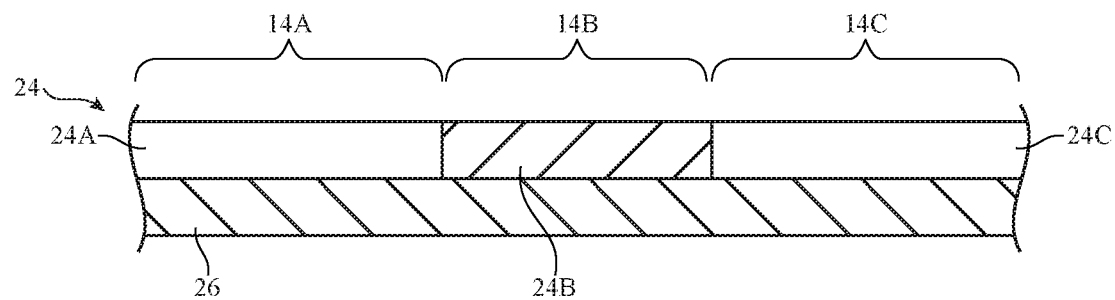
FIG. 6 is a cross-sectional side view of an illustrative display having display layers that extend between planar display cover layer portions and that span a flexible display cover layer portion that lies between the planar display cover layer portions in accordance with an embodiment.
Figure 7:
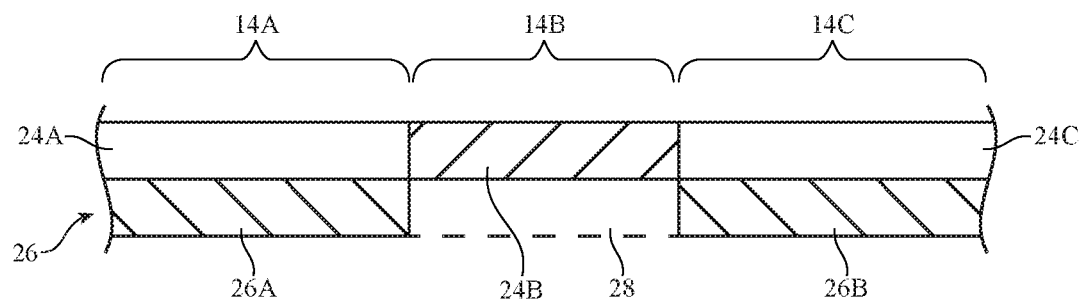
FIG. 7 is a cross-sectional side view of an illustrative display having display layers that extend under first and second planar display layer portions and that do not overlap a flexible display cover layer portion that lies between the planar display layer portions in accordance with an embodiment.

FIG. 6 is a cross-sectional side view of display 14 is an illustrative configuration in which display 14 has a single panel (display panel 26) that is overlapped by rigid areas 14A and 14C and that spans central flexible area 14B (i.e., the rectangular strip running parallel to axis 22 between areas 14A and 14C). FIG. 7 is a cross-sectional side view of display 14 in an illustrative configuration in which display 14 has display structures 26 that are formed from two separate display panels. Display panel 26A is located under rigid display cover layer portion 24A and display panel 26C is located under rigid display cover layer portion 24C. Flexible display cover layer portion 24B lies between rigid display cover layer portions 24A and 24C. Optional flexible structures 28 may be used to support display cover layer portion 24B. Structures 28 may include opaque masking layer structures. For example, structures 28 may include a layer of black ink on the underside of display cover layer portion 24B to hide internal components from view.

Materials such as glass, hard plastic, and other hard transparent materials may be used in forming rigid portions 24A and 24C of display cover layer 24. To ensure that portion 24B of display cover layer 24 in region 14B of display 14 is sufficiently flexible to accommodate bending about bend axis 22, portions of display cover layer 24 may be selectively removed from portion 24B to form recessed areas. By creating one or more recesses in portion 24B (relative to portions 24A and 24C), the flexibility of display cover layer 24 in region 14B of display 14 may be enhanced.

Figure 8:
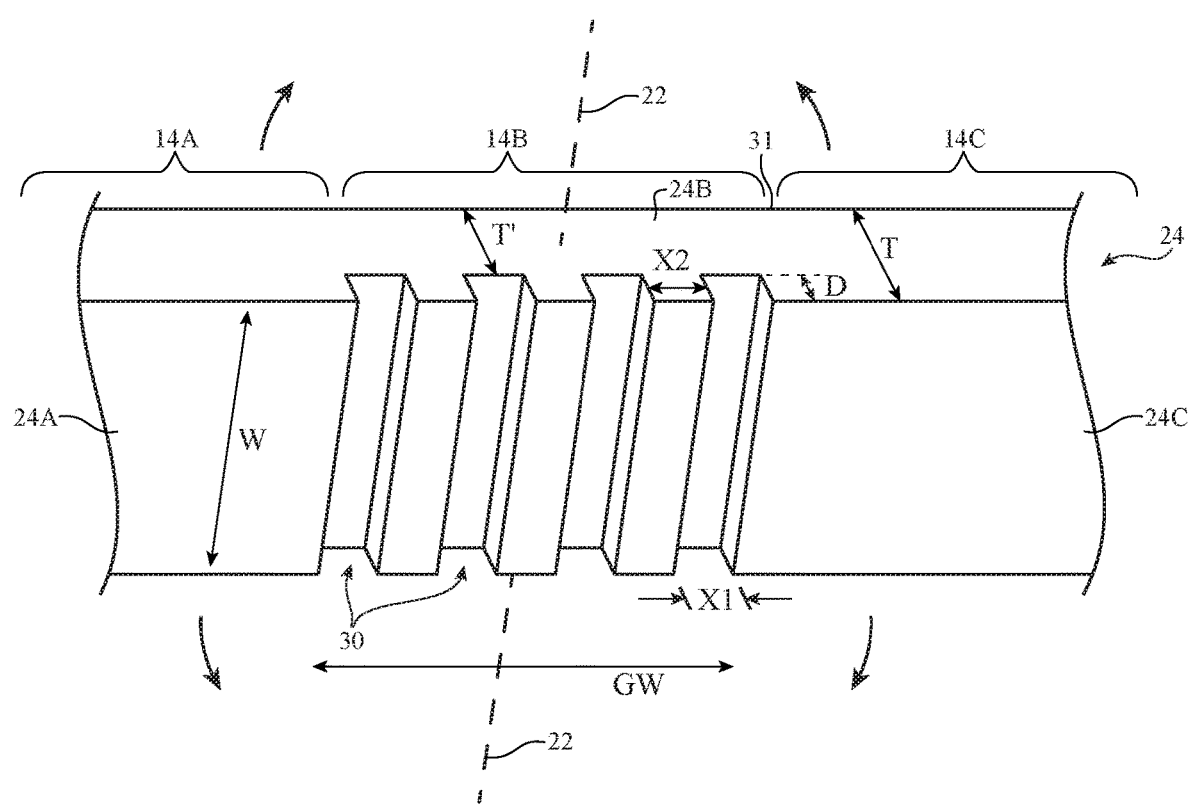
FIG. 8 is a perspective view of the inner surface of an illustrative display cover layer having a series of parallel grooves that run parallel to a bend axis for the display cover layer in accordance with an embodiment.
Figure 9:
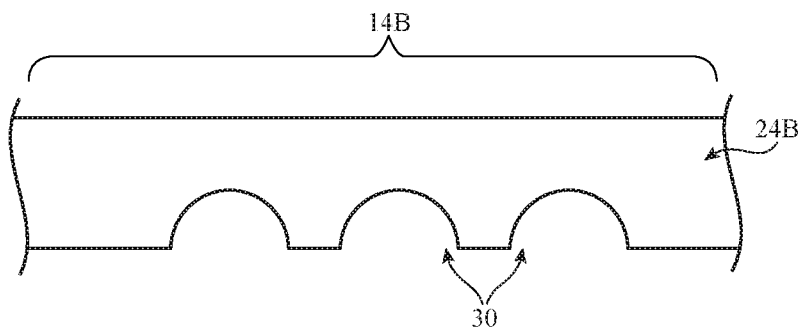
FIGS. 9, 10, 11, 12, and 13 are cross-sectional side views of flexible display cover layer regions having grooves with different configurations in accordance with an embodiment.
Figure 10:
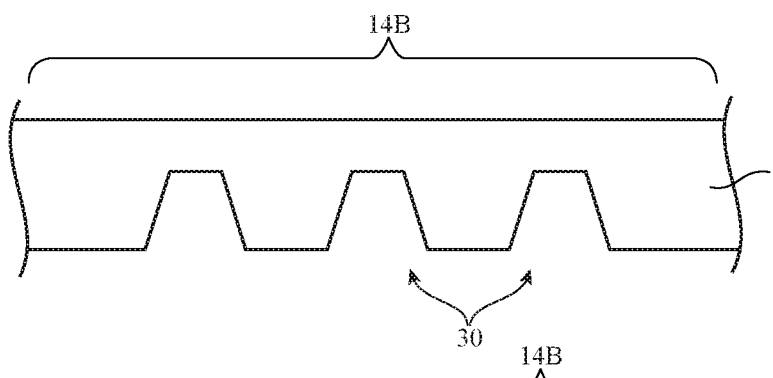

In the illustrative configuration of FIG. 8, display cover layer 24 has been provided with grooves 30 in area 14B. Grooves 30 may have depths D of about 50 microns (or more than 10 microns, more than 20 microns, 30-80 microns, 5-200 microns, less than 250 microns, less than 100 microns, less than 75 microns, less than 50 microns, or other suitable value). Grooves 30 may have widths X1 of 1-200 microns, more than 5 microns, more than 40 microns, more than 200 microns, more than 500 microns, less than 400 microns, less than 1 mm, less than 100 microns, 0.5-5 mm, or other suitable widths). The width W of display 14 may be 0.5-1000 cm, may be 1-300 cm, 1-100 cm, 1-20 cm, or other suitable width. Grooves 30 may span all of width W or may span a subset of width W. The width GW of flexible portion 24B of display cover layer 24 may be 10-1000 microns, may be more than 50 microns, may be more than 0.5 mm, may be more than 5 mm, may be 0.01-1 cm, may be less than 5 cm, may be less than 5 mm, may be less than 1 mm, may be 0.1-20 mm, or may be any other suitable width. The thickness T of display cover layer 24 may be 100 microns, 50-150 microns, more than 20 microns, less than 1000 microns, 20-500 microns, or other suitable thickness. The thickness T' of the portion of display cover layer 24 between the bottoms of grooves 30 and outer surface 31 of display cover layer 24 may be 50 microns, may be 100 microns, 50-150 microns, more than 20 microns, less than 1000 microns, less than 200 microns, less than 70 microns, less than 60 microns, 20-500 microns, or other suitable thickness. Relatively small thicknesses (e.g., 40-60 microns or less) may help enhance the flexibility of portion 24B of display cover layer 24. There may be 1-10,000 grooves 30 in portion 24B, more than 100 grooves 30 in portion 24B, fewer than 5000 grooves 30 in portion 24B, 50-3000 grooves 30 in portion 24B, more than 500 grooves 30 in portion 24B, more than 1000 grooves 30 in portion 24B, fewer than 8000 grooves 30 in portion 24B, or any other suitable number of grooves 30 in portion 24B. In general, any suitable dimensions may be used for the structures of display cover layer 24. The use of parallel grooves with rectangular cross-sectional shapes that run across the width of display 14 is merely illustrative.

Figure 11:
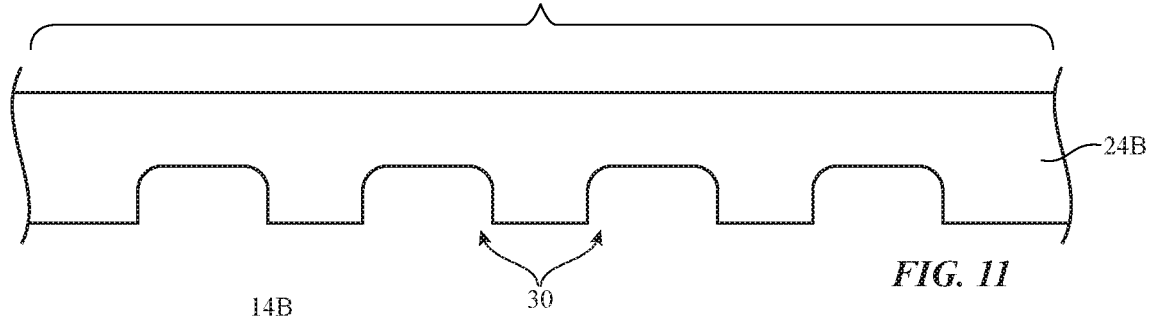

Grooves 30 may have any suitable shapes. As shown in the cross-sectional side view of grooves 30 of FIG. 9, grooves 30 may have a semicircular shape or other shape with curved sidewall surfaces. Grooves 30 of FIG. 10 have trapezoidal shapes. If desired, grooves 30 may have rectangular shapes with curved corners as shown in FIG. 11. Other cross-sectional shapes may be used for grooves 30 if desired. The illustrative groove profiles of FIGS. 8, 9, 10, and 11 are merely illustrative.

Figure 12:
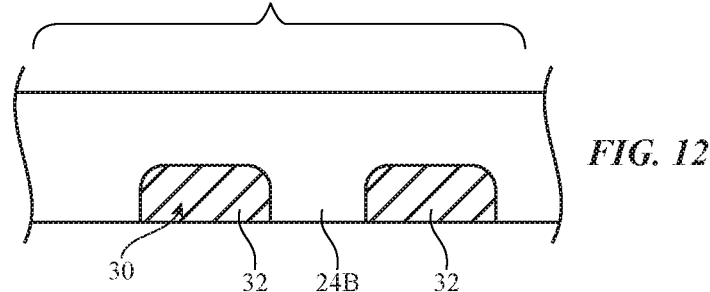
Figure 13:
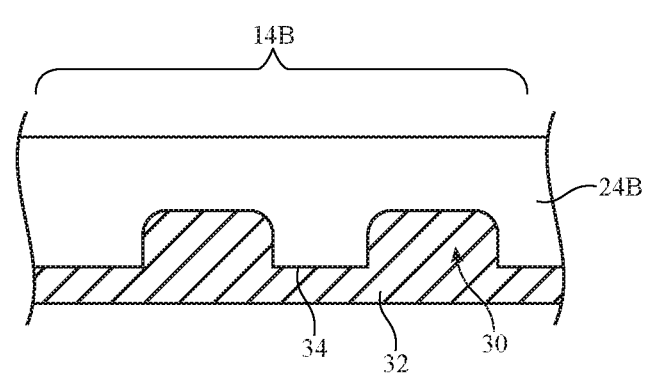

FIG. 12 shows how grooves 30 may be filled with a polymer or other flexible substance. Filler 32 may be, for example, a clear elastomeric polymer such as silicone to permit viewing of overlapped display structures or may be formed from an opaque polymer. Other filler materials may be used, if desired. In configurations in which filler 32 is transparent, filler 32 may have an index of refraction that matches the index of refraction of the display cover layer. For example, display cover layer portion 24B may have an index of refraction of 1.5 and filler 32 may be formed form a polymer with a matched index of refraction of 1.5 (or 1.4-1.6 or other suitable value close to 1.5). Filler 32 may help support portion 24B to prevent cracking. If desired, filler 32 may cover surfaces 34 of portion 24B, as shown in FIG. 13.

Figure 14:
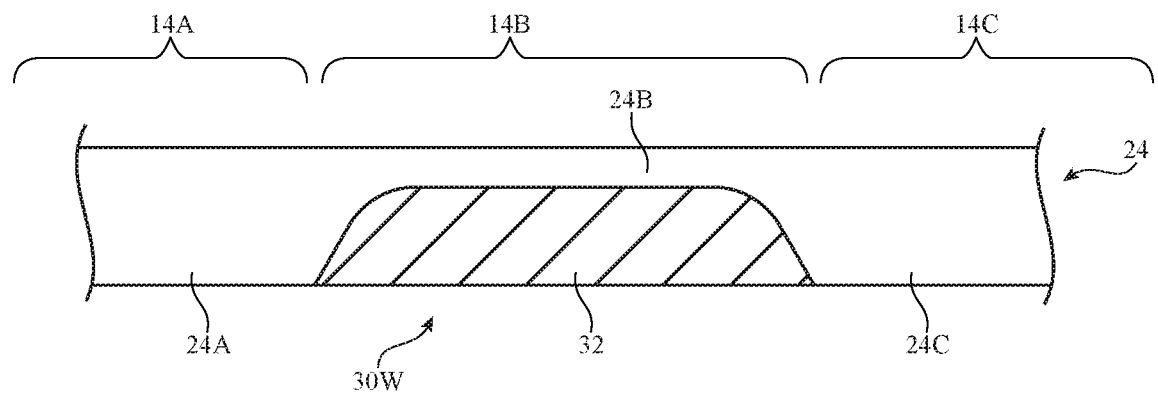
FIG. 14 is a cross-sectional side view of a portion of a display cover layer with a locally thinned region to enhance flexibility in accordance with an embodiment.
Figure 15:
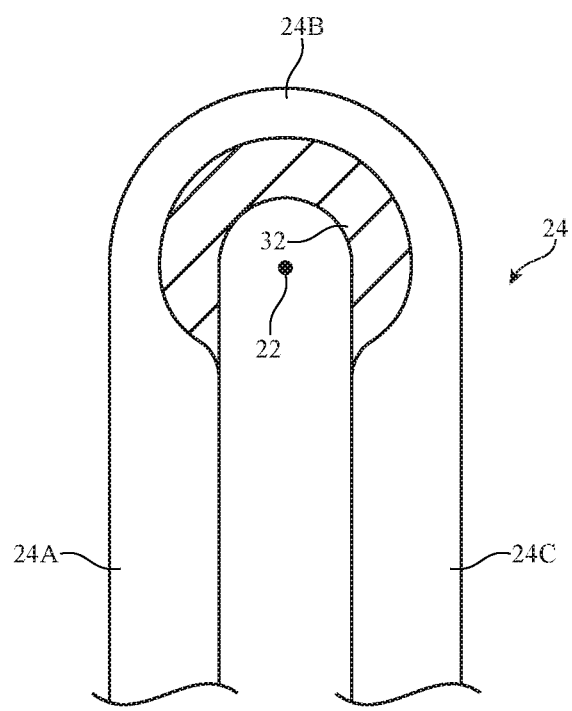
FIG. 15 is a cross-sectional side view of the structure of FIG. 15 in a bent configuration in accordance with an embodiment.

FIG. 14 is a cross-sectional side view of portion 24B of display cover layer 24 in an illustrative configuration in which portion 24B has been thinned relative to portions 24A and 24B (effectively forming a single wide recess such as recess 30 W). Recess 30 W may be filled with filler 32 to help support portion 24B. FIG. 15 shows how portion 24B may bend about bend axis 22.

Figure 16:
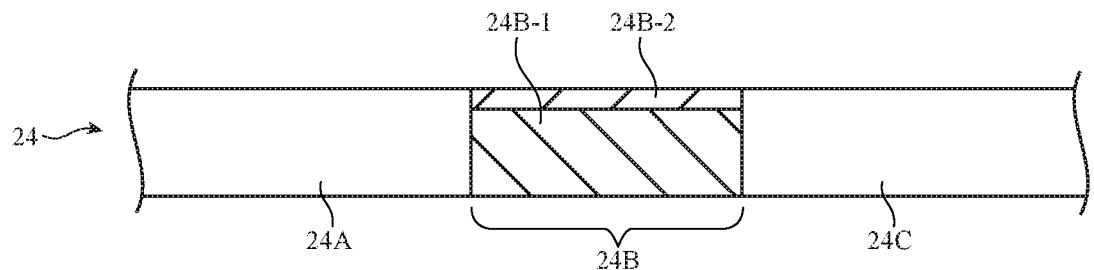
FIG. 16 is a cross-sectional side view of an illustrative display cover layer with a flexible portion covered with a hard coating layer in accordance with an embodiment.

The outer surface of display cover layer 24 may be covered with antireflection layers, antismudge layers, scratch resistance coatings, and other layers. As shown in FIG. 16, for example, flexible portion 24B of display cover layer 24 may have a flexible portion such as portion 24B-1 that is covered with a harder and more scratch resistant layer such as hard coating layer 24B-2. Layer 24B-2 may be formed form one or more inorganic layers such as silicon nitride, silicon oxide, etc. The thickness of layer 24B-2 and other coating layers in device 10 may be about 0.1-0.5 microns, less than 1 micron, more than 0.15 microns, or other suitable thickness.

Figure 17:
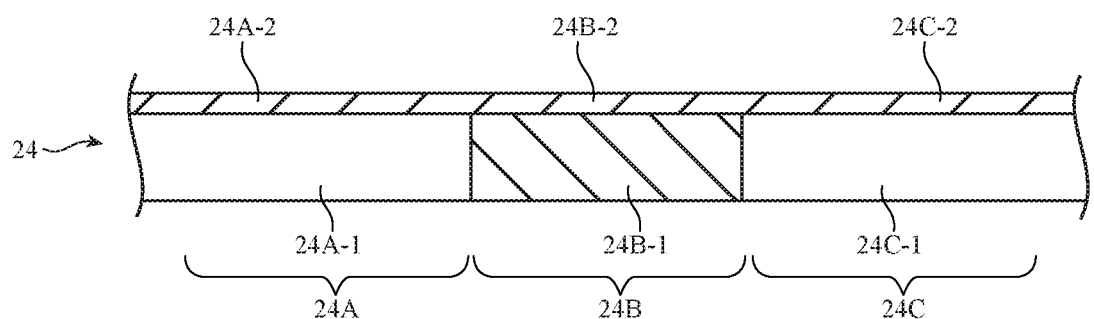
FIG. 17 is a cross-sectional side view of a display cover layer of the type shown in FIG. 16 in a configuration in which the hard coating layer extends across planar rigid portions of the display cover layer in addition to an interposed flexible portion in accordance with an embodiment.
Figure 18:
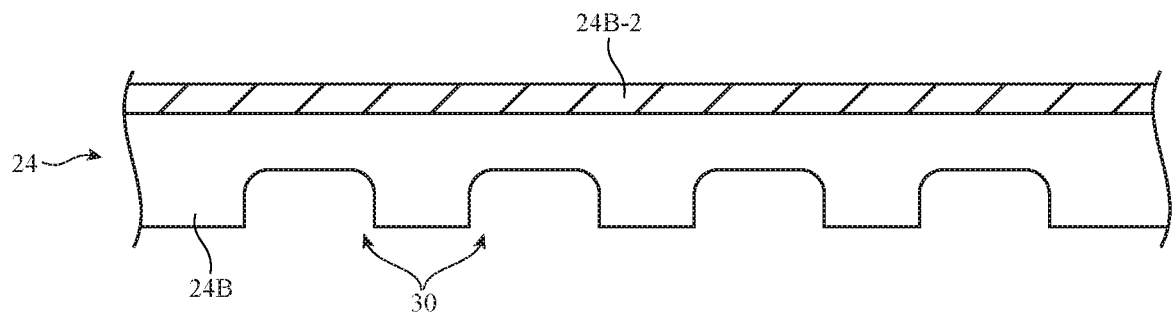
FIG. 18 is a cross-sectional side view of a display cover layer with grooves to form a flexible region and with a hard coating layer that covers the outer surface of the display cover layer in accordance with an embodiment.

As shown in the illustrative configuration of display cover layer 24 in FIG. 17, a hard coating layer (or other surface coating) may extend over portions 24A, 24B, and 24C of display cover layer 24. For example, portion 24A may have rigid layer 24A-1 that is covered with hard coating layer 24A-2. Portion 24C may have rigid layer 24C-1 that is covered with hard coating layer 24C-2. Flexible portion 24B of layer 24 may have flexible layer 24B-1 (e.g., flexible polymer, glass with grooves or other recesses, etc.) that is covered with hard coating layer 24B-2. FIG. 18 shows how a portion of display cover layer 24 such as flexible display cover layer 24B (having grooves 30 or other recesses) may be covered with hard coating layer 24B-2. This hard coating may be separate from the coatings on portions 24A and 24C or coating layer 24B-2 of FIG. 18 may extend over the entire surface of display cover layer 24.

Figure 19:
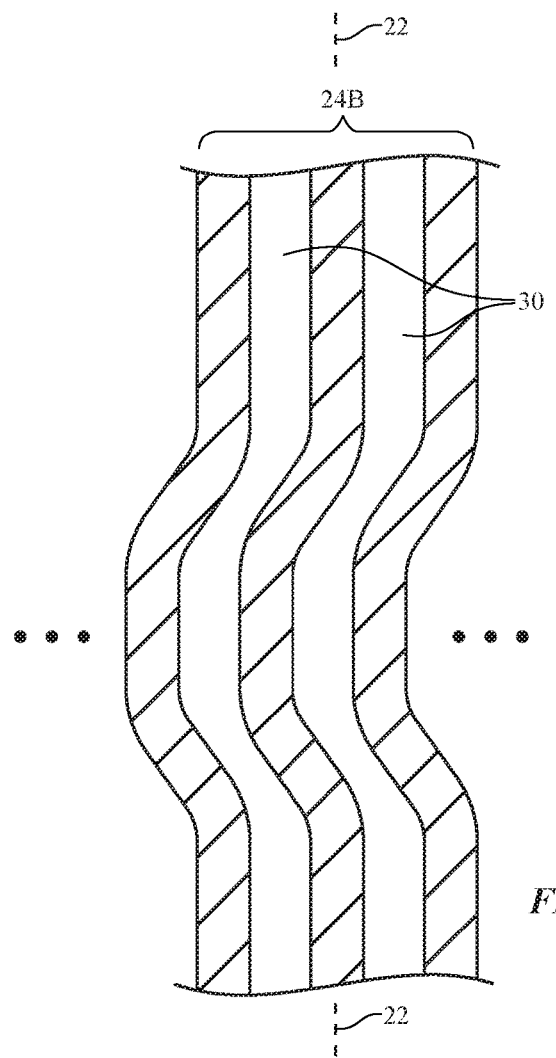
FIGS. 19, 20, and 21 are top views of illustrative display cover layer groove patterns to enhance flexibility in accordance with an embodiment.
Figure 20:
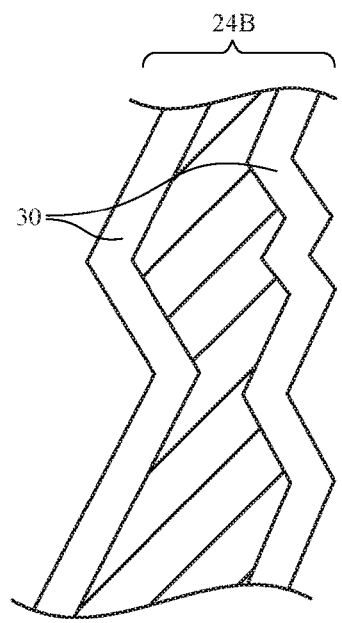
Figure 21:
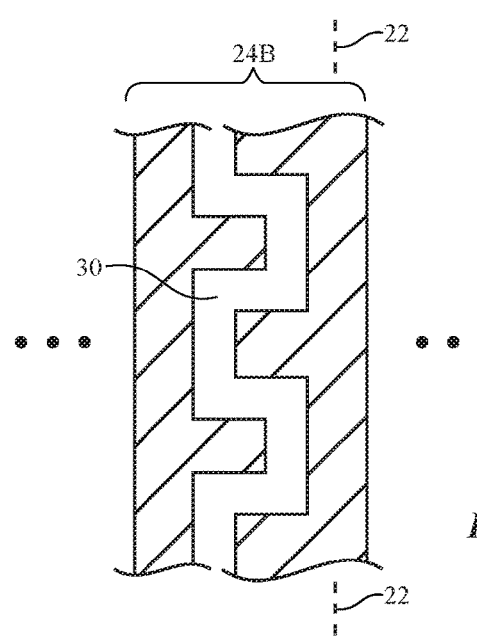

As shown in FIG. 19, grooves 30 need not be straight. In the FIG. 19 example, most of grooves 30 extend parallel to bend axis 22, but portions of grooves 30 of FIG. 19 meander away from axis 22. FIG. 20 shows how grooves 30 or other recesses in display cover layer 24B may have pseudorandom patterns to help prevent optical interference effects from creating visible artifacts on display 14. In the example of FIG. 21, grooves 30 have an elongated shape that extends along axis 22 and have interlocking features such as protrusions and recesses that extend perpendicular to axis 22.

Figure 22:
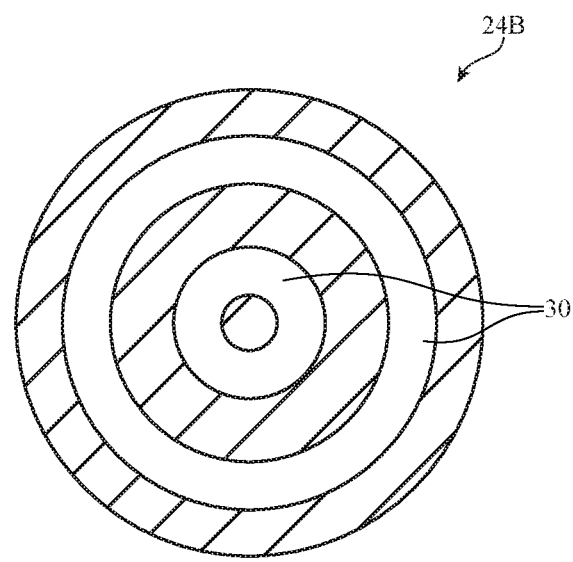
FIG. 22 is a top view of an illustrative display cover layer with radially symmetric grooves such as concentric circular grooves to provide the display cover layer with the ability to flex into a dome shape in accordance with an embodiment.
Figure 23:
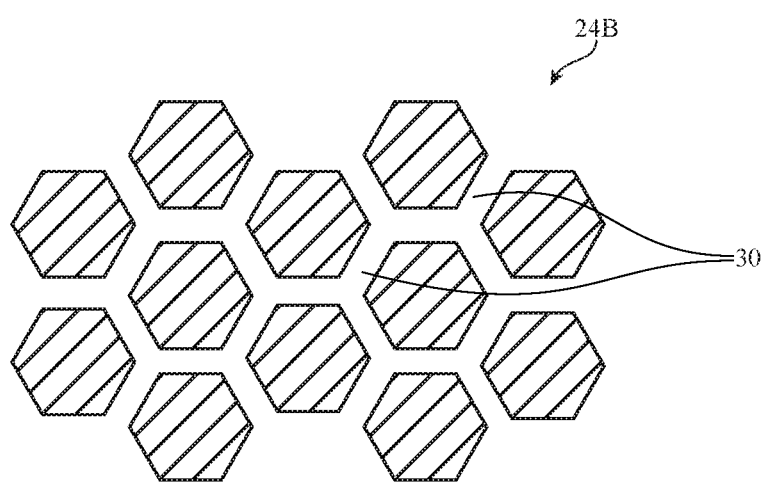
FIG. 23 is a top view of an illustrative display cover layer with hexagonal grooves in accordance with an embodiment.
Figure 24:
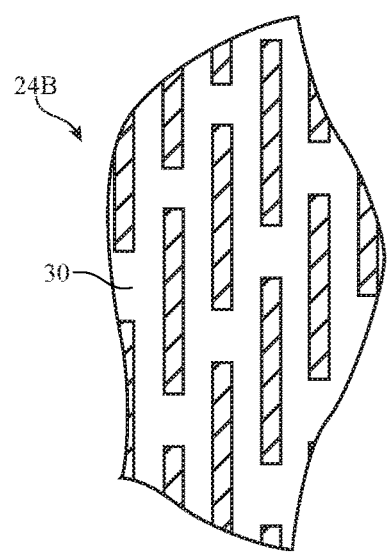
FIGS. 24, 25, and 26 are top views of additional display cover layer recess patterns in accordance with an embodiment.
Figure 25:
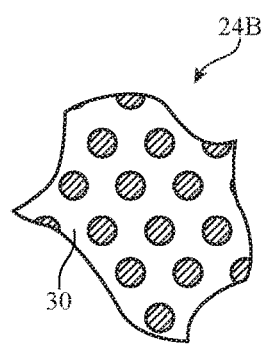
Figure 26:
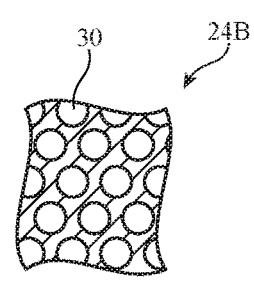

It may be desirable for display 14 to deform along more than one dimension. For example, it may be desirable for display 14 to flex into a shape with compound curves, a dome shape, etc. FIG. 22 is a diagram of display cover layer portion 24B in an illustrative configuration in which grooves 30 accommodate deformation along multiple axes. In particular, grooves 30 form concentric rings that allow portion 24B to deform into the shape of a dome. FIG. 23 shows how grooves 30 may be formed in a hexagonal matrix separating hexagonal islands formed by unrecessed areas of portion 24B. In the example of FIG. 24, grooves 30 are formed between rectangular strip-shaped islands in portion 24B and run parallel to bend axis 22. FIG. 25 shows how grooves 30 may be formed between circular dots or dots of other shapes that are not recessed. FIG. 26 shows how circular recessed portions (recesses 30) may be formed in portion 24B. Other patterns of recesses 30 may be provided in display layers such as display cover layer 24B or other layers of material in display 14 and/or housing 12 to enhance flexibility about bend axis 22, if desired.

Figure 27:
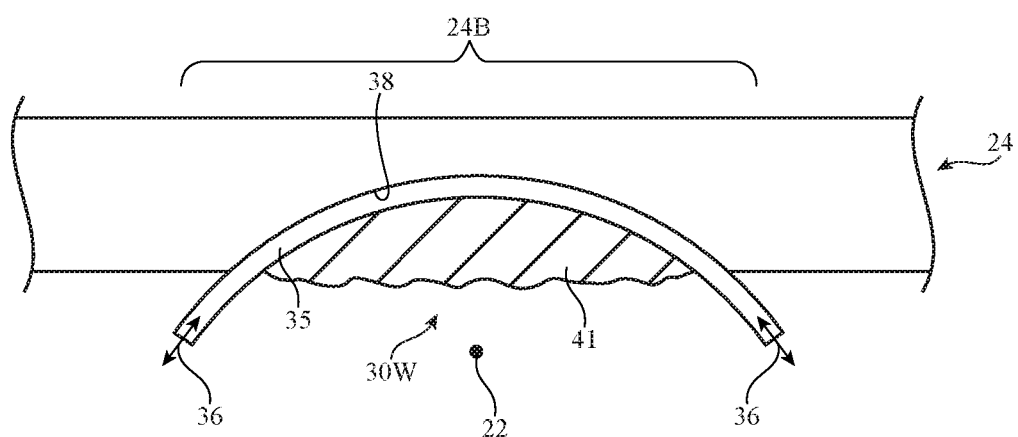
FIG. 27 is a cross-sectional side view of an illustrative display cover layer having a sliding support structure for a thinned region of the display cover layer in accordance with an embodiment.

In the example of FIG. 27, flexible portion 24B has been provided with a thinned portion such as wide groove 30 with a curved inner surface such as surface 38. Support member 35 may be used to support portion 24B. Member 35 may be formed from a sheet of metal, plastic, fiber composites, glass, other materials, or combinations of these materials. Foam 41 or other elastomeric material, mechanical biasing structures, or additional support structures in device 10 may be used to help hold member 35 in place against surface 38. Support member 35 may slide along inner surface 38 in directions 36 as display cover layer 24 is flexed about bend axis 22.

Figure 28:
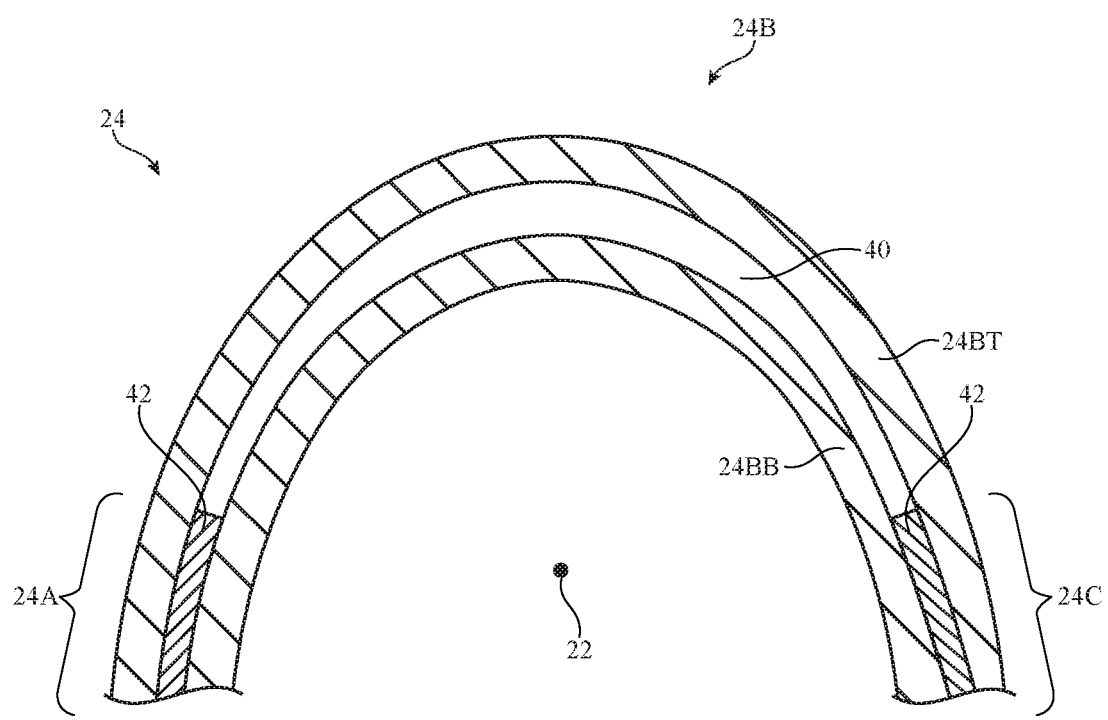
FIG. 28 is a cross-sectional side view of an illustrative multilayer display layer such as a display cover layer in a configuration in which a flexible portion of the display layer has layers that are not attached to each other to facilitate bending in accordance with an embodiment.

FIG. 28 is a cross-sectional side view of display cover layer 24 in an illustrative configuration in which display cover layer portion 24B includes multiple layers of material. In the FIG. 28 example, display cover layer 24 has outer layer 24BT and inner layer 24BB. The outer layer may be attached to the inner layer using adhesive 42 in rigid display cover layer portions 24A and 24B. In flexible display cover layer portion 24B, adhesive 42 may be omitted. This allows outer layer 24BT and inner layer 24BB to move relative to each other during bending about bend axis 22 (e.g., to form gap 40, to slide relative to each other, etc.). Adhesive 42 may be formed from an elastomeric material that permits lateral movement between the different layers making up display cover layer 24 during bending. The illustrative configuration of FIG. 28 includes two separate display cover layer, but three or more layers may be used in forming display cover layer 24, if desired.

Figure 29:
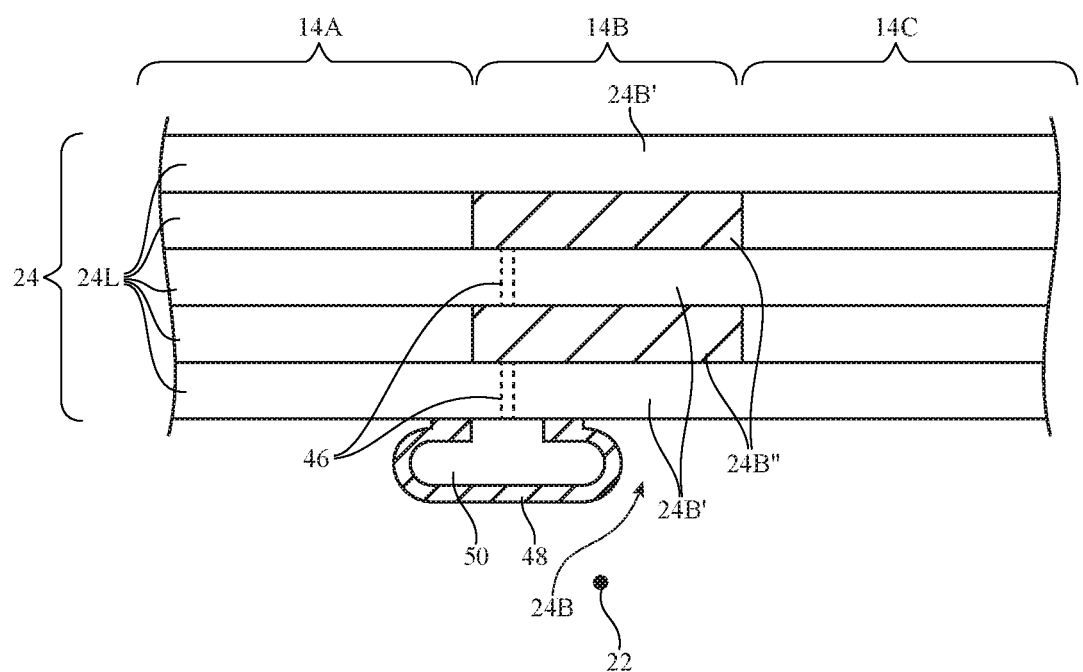
FIG. 29 is a cross-sectional side view of an illustrative display cover layer with multiple layers and fluid-filled regions in accordance with an embodiment.

As shown in FIG. 29, there may be gaps between the layers of a multi-layer display cover layer or other display layer. Display cover layer 24 of FIG. 29 has multiple layers such as layers 24L (e.g., layers of glass, plastic, sapphire, fiber-composite material, other materials, and/or combinations of these materials). Each of layers 24L may be sufficiently thin to facilitate bending (e.g., the thickness of each of layers 24L may be less than 100 microns, less than 75 microns, less than 50 microns, more than 10 microns, or other suitable thickness. In rigid display cover layer portions 24A and 24C, layers 24L may be attached to each other using intervening layers of adhesive (as an example). In flexible display cover layer portion 24B, layers 24L may include solid layers such as layers 24B' that are integral portions of layers 24L (e.g., glass, plastic, etc.) and intervening layers that have openings filled with material 24B" to facilitate bending. Material 24B" may be a compressible fluid such as air, nitrogen, or other gas, may be a polymer (e.g., an elastomeric polymer having an index of refraction that matches the index of refraction of layers 24L), may be an incompressible fluid such as water, oil, or other liquid (e.g., oil having an index of refraction matching the index of refraction of layers 24L), or may be any other suitable material that facilitates bending of portion 24B of layer 24. In configurations in which material 24B" is a liquid or gas, layer 24 may be provided with an excess fluid (liquid or gas) reservoir. The reservoir may have an elastomeric wall such as wall 48 forming a cavity 50 that expands to receive excess gas or liquid 24B" through passageways 46 through layers 24L when layer 24 is bent about bend axis 22 (which thins the gaps between layers 24L in flexible area 14B and thereby forces liquid 24B" into cavity 50).

Figure 30:
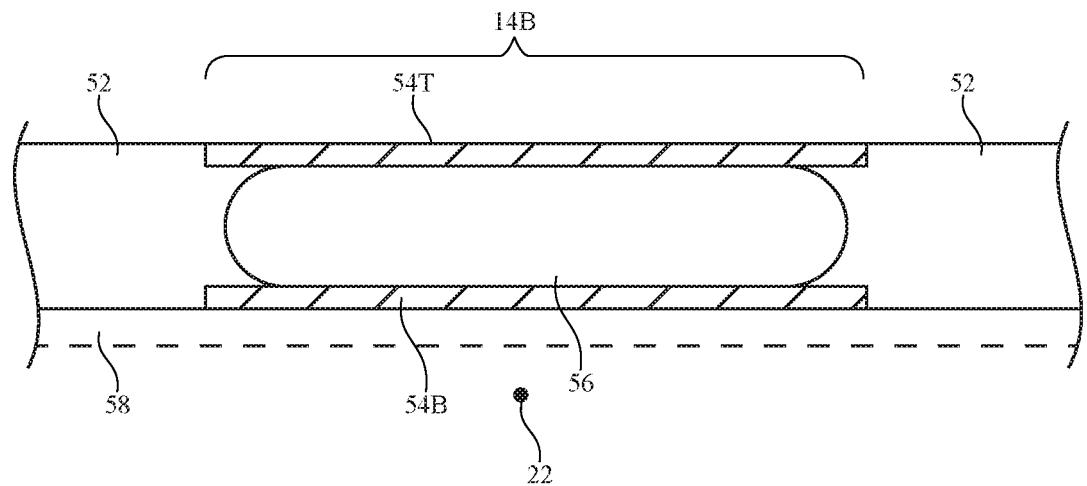
FIG. 30 is a cross-sectional side view of illustrative flexible structures for a hinge or other flexible portion of an electronic device in accordance with an invention.

FIG. 30 is a cross-sectional side view of an illustrative flexible structure of the type that may be used in forming hinge 20 of FIG. 1 and/or flexible display cover layer portion 24B or other flexible portions of device 10 to permit bending of device 10 about axis 22. Structures 52 of FIG. 30 may be rigid structures of metal, glass, plastic, fiber-composite material, sapphire, or other material (e.g., structures 52 may form display layers 24A and 24B in a display cover layer, housing walls, internal hinge structure layers, or other rigid layers for areas 14A and 14C). In area 14B of device 10, an opening (opening 56) may be formed in layers 52 to facilitate bending. Thin sheets of plastic or metal or other hinging members such as flexible layers 54T and 54B may be formed above and below opening 56 (e.g., flush with the outer and inner surfaces of structures 52. Layers 54T and 54B may be formed from polymer, metal, glass that is sufficiently thin to bend (e.g., glass with grooves), or other suitable materials. Opening 56 may be filled with air, oil, elastomeric polymer (solid or foam), etc.

Figure 31:
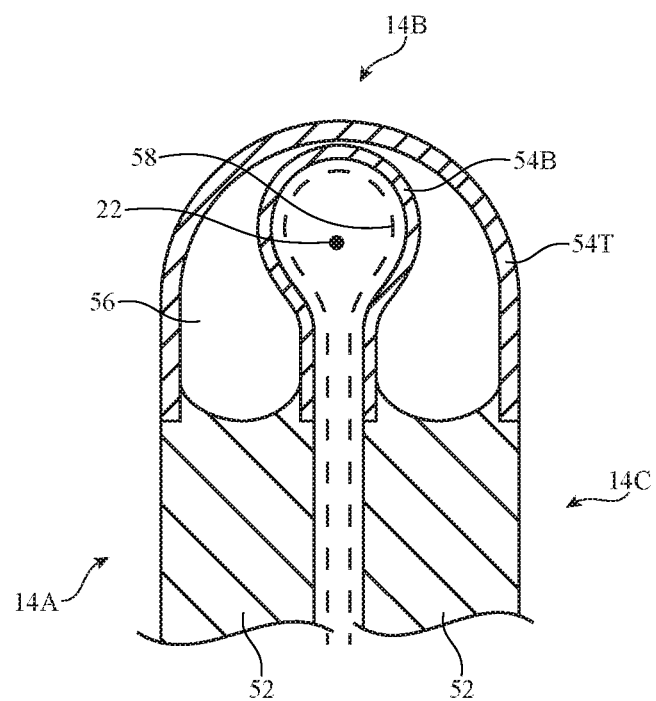
FIG. 31 is a cross-sectional side view of the flexible structures of FIG. 30 in a bent configuration in accordance with an embodiment.

One or more additional layers such as layer 58 may be attached under the surface of the structures of FIG. 30. Layer 58 may be, for example, a flexible display panel in configurations in which the structures of FIG. 30 such as layers 52 and 54T and 54B are transparent or may be any other suitable component for device 10 (e.g., a touch sensor layer, a structural support layer, etc.). FIG. 31 shows how inner layer 54B may bow outward and may contact (or nearly contact) the inner surface of outer layer 54T when the structures of FIG. 30 are bend about axis 22. In configurations in which layers 54T and 54B are formed from a springy material (e.g., metal or springy plastic), the hinge formed from layers 54T and 54B may exhibit a toggle effect when device 10 opens and closes.

Figure 32:
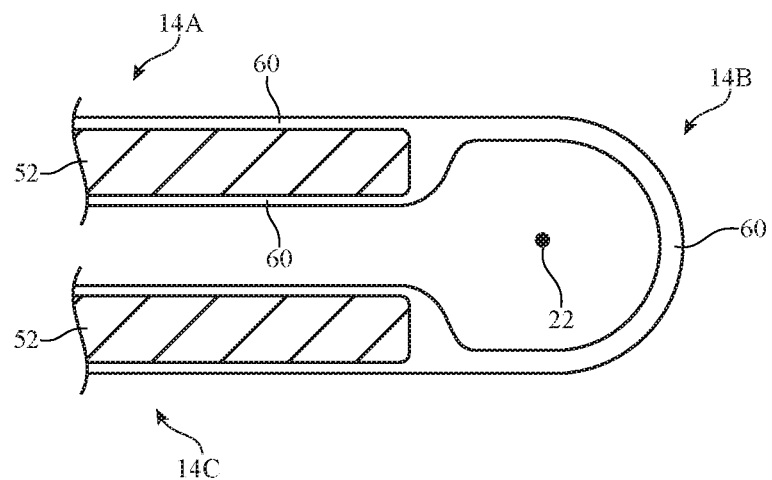
FIG. 32 is a cross-sectional side view of an illustrative display having a thinned region in a bent configuration in accordance with an embodiment.
Figure 33:
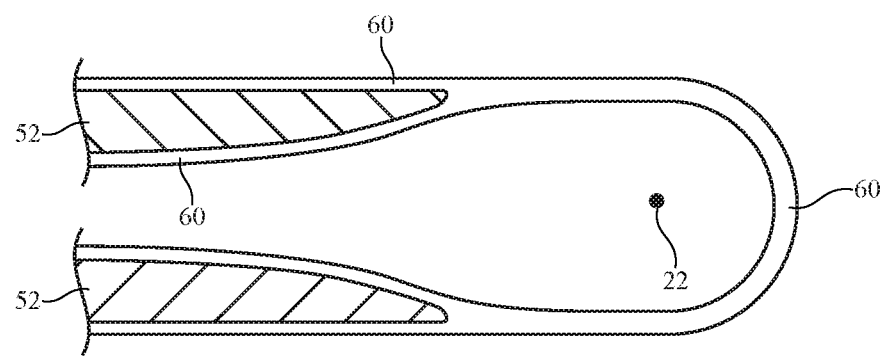
FIG. 33 is a cross-sectional side view of an illustrative display having a thinned region that is adjacent to support structures with eased edges in accordance with an embodiment.

In the example of FIG. 32, structures 52 have been sandwiched between outer and inner layers 60 in rigid areas 14A and 14C. In region 14B, layers 60 may merge to form a single layer of material or may be separate (e.g., separate layers such as layers 54T and 54B of FIGS. 30 and 31). Layers 60 are sufficiently thin to be flexible in region 14B. Layers 60 may be formed from glass, plastic, metal, or other suitable materials. Layers 60 may be transparent when layers 60 overlap pixels in a display and may be opaque when layers 60 form a hinge that does not lie on top of any pixels. If desired, edge 62 of structures 52 may be eased (e.g., progressively thinned at increasing distances towards the edges of structures 52) as shown in FIG. 33 to help reduce stresses in layers 60 when bent about bend axis 22.

Figure 34:
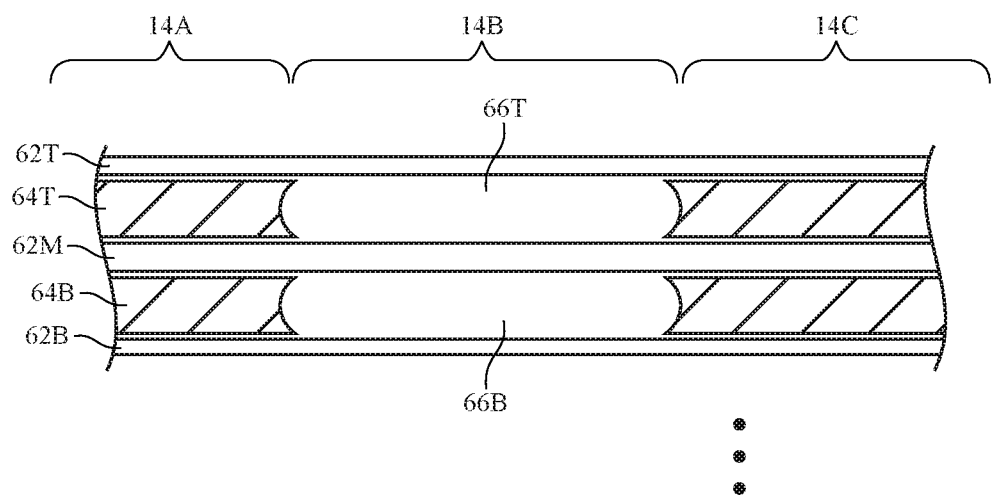
FIG. 34 is a cross-sectional side view of an illustrative hinge structure or other flexible structure formed from multiple layers of flexible structures in accordance with an embodiment.

FIG. 34 is a cross-sectional side view of an illustrative multilayer flexible structure for device 10. The flexible structure of FIG. 34 may form part of a display cover layer such as flexible portion 24B, a hinge such as hinge 20 of FIG. 1, a flexible housing wall or internal housing structure, or other flexible layer in device 10. Layers 64T and 64B may be rigid planar layers of material (glass, plastic, metal, etc.). Layers 62T, 62M, and 62B may be formed from thin flexible glass layers, polymer layers, metal layers, or layers of other material. Layer 64T may be sandwiched between outer layer 62T and middle layer 62M. Layer 64B may be sandwiched between middle layer 62M and inner layer 62B. Layers such as layers 62M and 62B may bow outwards towards layer 62T when the structures of FIG. 34 are bent. There may be additional layers in the structures of FIG. 34 if desired. The configuration of FIG. 34 is merely illustrative.

Layer 64T may have an opening such as opening 66T to enhance flexibility in flexible area 14B. Layer 64B may have an opening such as opening 66B to enhance flexibility in flexible area 14B. Openings 66T and 66B may be filled with flexible materials such as air, other gasses, liquids (e.g., index-matched oil), flexible polymer (foam, solid materials such as solid silicone layers), etc.

Figure 35:
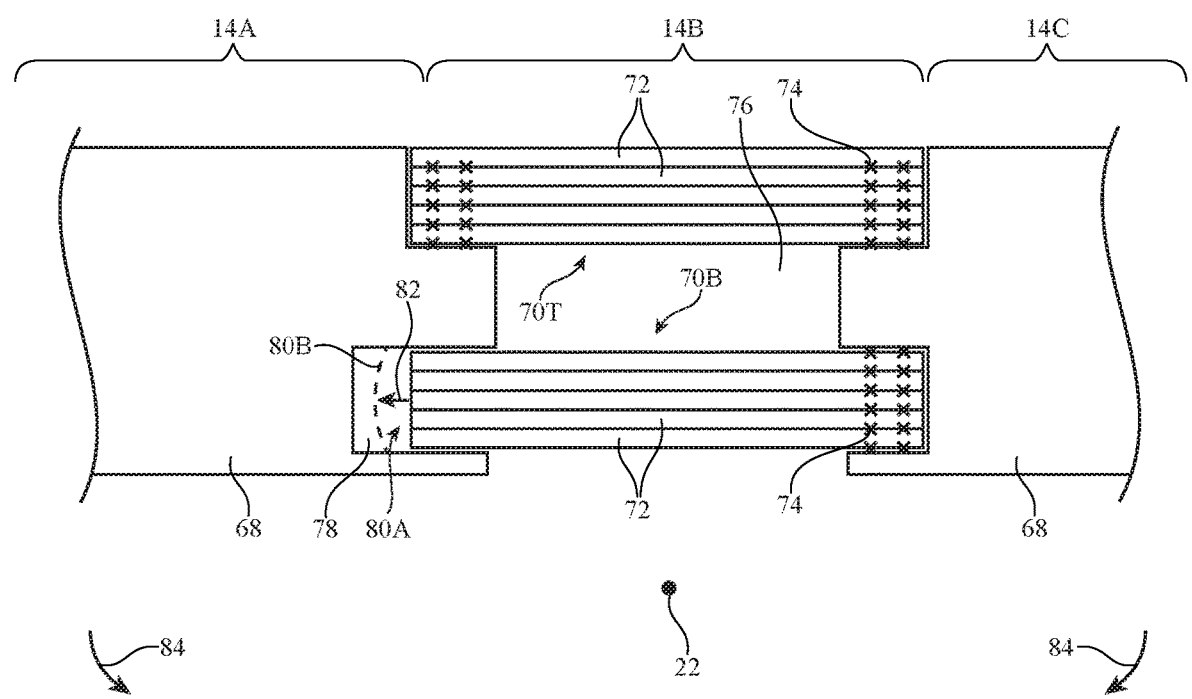
FIG. 35 is a cross-sectional side view of an illustrative flexible structure for an electronic device in accordance with an embodiment.

FIG. 35 is a cross-sectional side view of an illustrative multilayer flexible structure for device 10 having a layer that can slide within a rigid support structure. The flexible structure of FIG. 35 may be a display cover layer such as flexible portion 24B, a hinge such as hinge 20 of FIG. 1, a flexible housing wall or internal housing structure, or other flexible layer in device 10. Layer 68 may be a rigid planar layer of material (glass, plastic, metal, etc.). Flexible layers 70T and 70B may span opening 76 in layer 68 in flexible area 14B and may be formed on opposing sides of opening 76. Layers 70T and 70B may be mounted so as to be flush with the opposing inner and outer surfaces of layer 68. Layers 70T and 70B may each be formed from a single layer of material or may, as shown in FIG. 35, each include multiple sublayers 72 (e.g., thin layers of glass, plastic, metal, or other flexible layers of material). Adhesive 74 may attach layers 74 to each other and to layer 68. If desired, some portions of layers 74 (e.g., the left edge of lower layer 70B in the example of FIG. 35) may be left unattached to layer 68 (and if desired, unattached to each other). These unattached portions of layer 70B may permit stress-relieving sliding motions to take place between layer 70B and layer 68 (and between sublayers 72) when bending the structures of FIG. 35 in directions 84 about bend axis 22. Opening 76 may be filled with air, liquid or polymer (e.g., index matching liquid or polymer in scenarios in which layers 70T and 70B are transparent), or other suitable materials.

Layer 68 may have a slot such as slot 78. Left edge 80A of layer 70B (in the example of FIG. 35) is not attached to layer 68 with adhesive 74, so edge 80A may move into slot 78 in direction 82 to position 80B when the structures of FIG. 35 are bent about bend axis 22 in directions 84.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a housing that bends about a bend axis;
   a touch sensor that bends about the bend axis;
   a pixel array in the housing, wherein the pixel array is operable in a folded configuration and an unfolded configuration; and
   a display cover layer that overlaps the pixel array and the touch sensor, wherein the pixel array and the touch sensor are located behind the display cover layer, wherein the display cover layer comprises first and second layers, wherein the second layer has first and second portions separated by a gap, wherein the gap overlaps the bend axis, wherein the first layer overlaps the gap, and wherein the first and second portions are coplanar when the pixel array is unfolded.

2. The electronic device defined in claim 1 wherein the display cover layer comprises a third layer that overlaps the bend axis.

3. The electronic device defined in claim 2 wherein the second layer comprises a layer of adhesive that attaches the first layer to the third layer.

4. The electronic device defined in claim 3 wherein the third layer bows toward the first layer when the pixel array is folded.

5. The electronic device defined in claim 4 wherein the first and third layers lie in parallel planes when the pixel array is unfolded.

6. The electronic device defined in claim 3 wherein the layer of adhesive comprises an elastomeric material that permits sliding of the first layer relative to the third layer when the pixel array is folded.

7. The electronic device defined in claim 1 wherein the housing comprises a hinge that overlaps the bend axis.

8. The electronic device defined in claim 7 wherein the hinge comprises a layer that slides within an opening in the housing.

9. The electronic device defined in claim 1 wherein the display cover layer comprises glass.

10. The electronic device defined in claim 1 wherein the pixel array comprises organic light-emitting diode pixels.

11. A display that folds along a bend axis, comprising:
a pixel array that overlaps the bend axis; and
a transparent glass layer that overlaps the pixel array, wherein the transparent glass layer comprises first and second portions and includes trenches interposed between the first and second portions, wherein the first portion overlaps a first region of the pixel array, wherein the second portion overlaps a second region of the pixel array, wherein the trenches overlap the bend axis, and wherein the first and second portions are coplanar when the display is unfolded.

12. The display defined in claim 11 further comprising an additional transparent layer that overlaps the first region of the pixel array, the second region of the pixel array, and the trenches.

13. The display defined in claim 12 further comprising a polymer in the trenches.

14. The display defined in claim 13 wherein the polymer has an index of refraction that matches that of the additional transparent layer.

15. The display defined in claim 11 wherein the trenches are filled with a fluid.

16. An electronic device, comprising:
a housing that folds along a bend axis;
a pixel array that overlaps the bend axis; and
a cover layer that overlaps the pixel array and the bend axis, wherein the cover layer has opposing inner and outer surfaces through which the pixel array displays images, wherein the inner surface faces the pixel array, and wherein the cover layer comprises a groove in the inner surface that overlaps the bend axis and that extends only partially through the cover layer.

17. The electronic device defined in claim 16 further comprising a hard coating layer that overlaps the bend axis.

18. The electronic device defined in claim 16 wherein the groove has a sidewall selected from the group consisting of: a straight sidewall and a curved sidewall.

19. The electronic device defined in claim 16 wherein the groove has at least a portion that is non-parallel to the bend axis.

20. The electronic device defined in claim 16 wherein the electronic device further comprises a support member that slides within the groove.

* * * * *